(12) United States Patent
Ratcliffe et al.

(10) Patent No.: US 10,339,234 B2
(45) Date of Patent: Jul. 2, 2019

(54) METHOD FOR ELASTIC MODEL PERTURBATION ESTIMATION FROM REVERSE TIME MIGRATION

(71) Applicant: CGG SERVICES SA, Massy (FR)

(72) Inventors: Andrew Ratcliffe, Henfield (GB); Graham Roberts, Forest Row (GB); Lian Duan, Crawley (GB)

(73) Assignee: CGG SERVICES SAS, Massy (FR)

( * ) Notice: Subject to any disclaimer, the term of this patent is extended or adjusted under 35 U.S.C. 154(b) by 394 days.

(21) Appl. No.: 14/947,111

(22) Filed: Nov. 20, 2015

(65) Prior Publication Data

US 2016/0146961 A1 May 26, 2016

Related U.S. Application Data

(60) Provisional application No. 62/084,347, filed on Nov. 25, 2014.

(51) Int. Cl.
*G06F 17/50* (2006.01)
*G01V 1/28* (2006.01)
*G01V 1/30* (2006.01)

(52) U.S. Cl.
CPC .......... *G06F 17/5009* (2013.01); *G01V 1/282* (2013.01); *G01V 1/286* (2013.01); *G01V 1/306* (2013.01); *G01V 2210/512* (2013.01); *G01V 2210/614* (2013.01); *G01V 2210/6224* (2013.01); *G01V 2210/6226* (2013.01); *G01V 2210/675* (2013.01); *G01V 2210/679* (2013.01)

(58) Field of Classification Search
CPC combination set(s) only.
See application file for complete search history.

(56) References Cited

U.S. PATENT DOCUMENTS

| 6,826,483 | B1 * | 11/2004 | Anderson | G01V 1/30 |
| | | | | 702/13 |
| 9,638,830 | B2 * | 5/2017 | Meyer | G01V 99/005 |
| 2010/0118651 | A1 * | 5/2010 | Liu | G01V 1/282 |
| | | | | 367/50 |
| 2012/0316850 | A1 * | 12/2012 | Liu | G01V 1/28 |
| | | | | 703/6 |
| 2013/0343154 | A1 | 12/2013 | Zhang et al. | |

(Continued)

OTHER PUBLICATIONS

Improving RTM images with angle gathers Sean Crawley, N. D. Whitmore, Armando Sosa and Mike Jones; PGS.*

(Continued)

*Primary Examiner* — Mamadou L Diallo
(74) *Attorney, Agent, or Firm* — Patent Portfolio Builders PLLC (57) ABSTRACT

An Earth model of a subsurface is created from acquired seismic data by migrating at least one of the incident wavefields and reflected wavefields to generate angle gathers for the seismic data and identifying for the subsurface an elastic Earth model equation for the incident wavefields and the reflected wavefields in the acquired seismic data. The elastic Earth model is a function of reflection angle between the incident wavefields and reflected wavefields and elastic parameters and is fit to the generated angle gathers through perturbation in the elastic parameters. The generated perturbations are used to create the Earth model of the subsurface.

20 Claims, 4 Drawing Sheets

(56) References Cited

U.S. PATENT DOCUMENTS

| | | | | |
|---|---|---|---|---|
| 2014/0301158 | A1* | 10/2014 | Zhang | G01V 1/34 367/7 |
| 2016/0187514 | A1* | 6/2016 | Dellinger | G01V 1/282 367/24 |
| 2016/0238729 | A1* | 8/2016 | Warner | G01V 1/282 |
| 2016/0245941 | A1* | 8/2016 | Ronholt | G01V 1/282 |
| 2016/0327668 | A1* | 11/2016 | Pires De Vasconcelos | G01S 15/8977 |
| 2017/0254912 | A1* | 9/2017 | Koren | G01V 1/345 |
| 2018/0217285 | A1* | 8/2018 | Walters | G01V 1/303 |

OTHER PUBLICATIONS

E. Baysal et al., "Reverse Time Migration", Geophysics, Nov. 1983, vol. 48, No. 11, pp. 1514-1524.

G. McMechan, "Migration by Extrapolation of Time-Dependent Boundary Values", Geophysical Prospecting, 1983, vol. 31, pp. 413-420.

R. Shuey, "A Simplification of the Zoeppritz Equations", Geophysics, Apr. 1985, vol. 50, No. 4, pp. 609-614.

G. Smith et al., "Weighted Stacking for Rock Property Estimation and Detection of Gas", Geophysical Prospecting, 1987, vol. 35, pp. 993-1014.

N. Whitmore, "Iterative Depth Migration by Backward Time Propagation", SEG Technical Expanded Abstracts, 1983, pp. 382-385.

S. Xu et al., "3D Angle Gathers from Reverse Time Migration", Geophysics, Mar.-Apr. 2011, vol. 76, No. 2, pp. S77-S92.

Y. Zhang et al., "Amplitude-Preserving Reverse Time Migration: From Reflectivity to Velocity and Impedance Inversion", Geophysics, Nov.-Dec. 2014, vol. 79, No. 6, pp. S271-S283.

Y. Zhang et al., "Practical Issues in Reverse Time Migration: True Amplitude Gathers, Noise Removal and Harmonic Source Encoding", first break, Jan. 2009, vol. 27, pp. 53-59.

* cited by examiner

METHOD FOR ELASTIC MODEL PERTURBATION ESTIMATION FROM REVERSE TIME MIGRATION

RELATED APPLICATION

The present application is related to, and claims priority from U.S. Provisional Patent Application No. 62/084,347, filed Nov. 25, 2014, entitled "Method for Elastic Model Perturbation Estimation from Reverse Time Migration", the entire disclosure of which is incorporated herein by reference.

TECHNICAL FIELD

Embodiments of the subject matter disclosed herein generally relate to methods and systems for seismic data processing and, more particularly, to mechanisms and techniques utilizing migration and elastic wave equations to model the subsurface of the Earth.

BACKGROUND

Reverse time migration (RTM) is a well-established seismic imaging technology especially designed for areas of complex geology. RTM uses the two-way wave equation to improve the handling of velocity complexity and to image the steep dips by utilizing reflections, transmissions, diffractions and prism waves. Previous methods have discussed how RTM can be adapted to generate velocity and impedance perturbations from an analysis of output angle gathers. This adaptation of RTM was applied in the context of the acoustic approximation and subsequently ended up with an acoustic version of Aki, K., and P. Richards, "Quantitative Seismology: Theory and Methods", W.H. Freeman and Co. (1980) approximation to the P-wave to P-wave (PP) Zoeppritz equation.

In general, accurate velocity, impedance and/or elastic model perturbations are extremely valuable in the seismic imaging problem, whether for directly updating the underlying velocity, impedance, density, anisotropy or elastic parameters in an Earth model, or for use as an interpretation tool. However, the previous uses of RTM to generate angle gathers was applied to an acoustic version of the Zoeppritz equation. The use of the acoustic wave equation limits the application of these previous uses to acoustic or pressure waves. However, real seismic data includes both pressure and shear wavefields as both incident and reflected wavefields. Therefore, an improved method for updating subsurface parameters such as velocity, impedance and density to obtain an accurate Earth model that can account for both pressure and shear wavefields from seismic data is desired.

SUMMARY

Embodiments are directed to methods and systems that generate, for acquired seismic data, angle gathers from a migration methodology such as reverse time migration (RTM) using perturbation technology. Then, an elastic Earth model equation is used to fit these angle gathers to extract elastic model perturbations, or parameters containing combinations of these elastic model perturbations. Suitable elastic Earth model equations compute or estimate the reflectivity of a plane wave at an interface within the subsurface and include the full elastic Zoeppritz PP-amplitude versus angle equation as well as approximations to this equation. As an extension to this new migration process, the migrated imaging can be converted wave (PS or SP) imaging or shear wave (SS) imaging. In this case, the full elastic Zoeppritz PP-amplitude versus angle equation, or any suitable approximation that is being used, employs the corresponding PS, SP or SS amplitude versus angle equation for the full elastic Zoeppritz equation or any suitable approximation being used.

Embodiments overcome the acoustic or pressure wave restrictions by generalizing the observed links between the acoustic RTM case and the acoustic Zoeppritz equation to an analysis using the elastic Zoeppritz equation, or approximations to the elastic Zoeppritz equation. This achieves a technical advantage of allowing a more correct application to real data of the RTM perturbation technology. In addition, embodiments are applicable to the multi-component (PS, SP and SS) worlds. The result is enhanced imaging and interpretation of the subsurface.

In one embodiment, a method for creating an Earth model of a subsurface acquires seismic data for the subsurface. The seismic data includes at least one of the incident wavefields and reflected wavefields associated with at least one reflector in the subsurface. The incident wavefields and reflected wavefields include both pressure wavefields and shear wavefields.

At least one of the incident wavefields and reflected wavefields is migrated to generate angle gathers for the seismic data. Migration includes using Kirchhoff depth migration, Gaussian beam migration, wave-equation migration or reverse time migration. An elastic Earth model equation is identified for the subsurface for the incident wavefields and the reflected wavefields in the acquired seismic data. The elastic Earth model is a function of the reflection angle between the incident wavefields and reflected wavefields and elastic parameters. In one embodiment, identifying the elastic Earth model includes identifying a full elastic Zoeppritz amplitude versus angle equation or an approximation of the full elastic Zoeppritz amplitude versus angle equation. In one embodiment, the elastic Earth model equation is limited to reflection angles up to about 30°. In one embodiment, a three-term Shuey equation is identified and the third, higher angle term is removed to limit the Shuey equation to reflection angles up to about 30°.

Perturbations of the elastic parameters in the elastic Earth model equation are generated to fit the elastic Earth model equation to the generated angle gathers. The elastic parameters include p-wave velocity, s-wave velocity, density, anisotropy and impedance. The generated perturbations are used to create the Earth model of the subsurface, and this Earth model of the subsurface is outputted and displayed.

In one embodiment, a computer-readable medium containing computer-executable code that when read by a computer causes the computer to perform a method for creating an Earth model of a subsurface is provided. This method includes acquiring seismic data for the subsurface. The seismic data include at least one of the incident wavefields and reflected wavefields associated with at least one reflector in the subsurface. At least one of the incident wavefields and reflected wavefields are migrated to generate angle gathers for the seismic data, and an elastic Earth model equation is identified for the subsurface for the incident wavefields and the reflected wavefields in the acquired seismic data. The elastic Earth model is a function of reflection angle between the incident wavefields and reflected wavefields and elastic parameters. Perturbations of the elastic parameters in the elastic Earth model equation are generated to fit the elastic Earth model equation to the generated angle gathers, and the generated perturbations are used to create the Earth model of the subsurface.

In one embodiment, a computing system for creating an Earth model of a subsurface includes a storage device containing seismic data for the subsurface. The seismic data include at least one of the incident wavefields and reflected wavefields associated with at least one reflector in the subsurface. The incident wavefields and reflected wavefields include both pressure wavefields and shear wavefields. The computing system also includes a processor in communication with the storage device. The processor is configured to migrate at least one of the incident wavefields and reflected wavefields to generate angle gathers for the seismic data, identify for the subsurface an elastic Earth model equation for the incident wavefields and the reflected wavefields in the acquired seismic data wherein the elastic Earth model is a function of reflection angle between the incident wavefields and reflected wavefields and elastic parameters, generate perturbations of the elastic parameters in the elastic Earth model equation to fit the elastic Earth model equation to the generated angle gathers and use the generated perturbations to create the Earth model of the subsurface. The elastic parameters include p-wave velocity, s-wave velocity, density, anisotropy and impedance.

In one embodiment, the processor is further configured to use Kirchhoff depth migration, Gaussian beam migration, wave-equation migration or reverse time migration to migrate at least one of the incident and reflected wavefields. In another embodiment, the processor is further configured to identify a full elastic Zoeppritz amplitude versus angle equation or an approximation of the full elastic Zoeppritz amplitude versus angle equation. In another embodiment, the processor is further configured to limit the elastic Earth model equation to reflection angles up to about 30°.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the embodiments refers to the accompanying drawings. The same reference numbers in different drawings identify the same or similar elements. The following detailed description does not limit the invention. Instead, the scope of the invention is defined by the appended claims. Some of the following embodiments are discussed, for simplicity, with regard to the terminology and structure of estimating perturbations in Earth model parameters. However, the embodiments to be discussed next are not limited to these configurations, but may be extended to other arrangements as discussed later.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
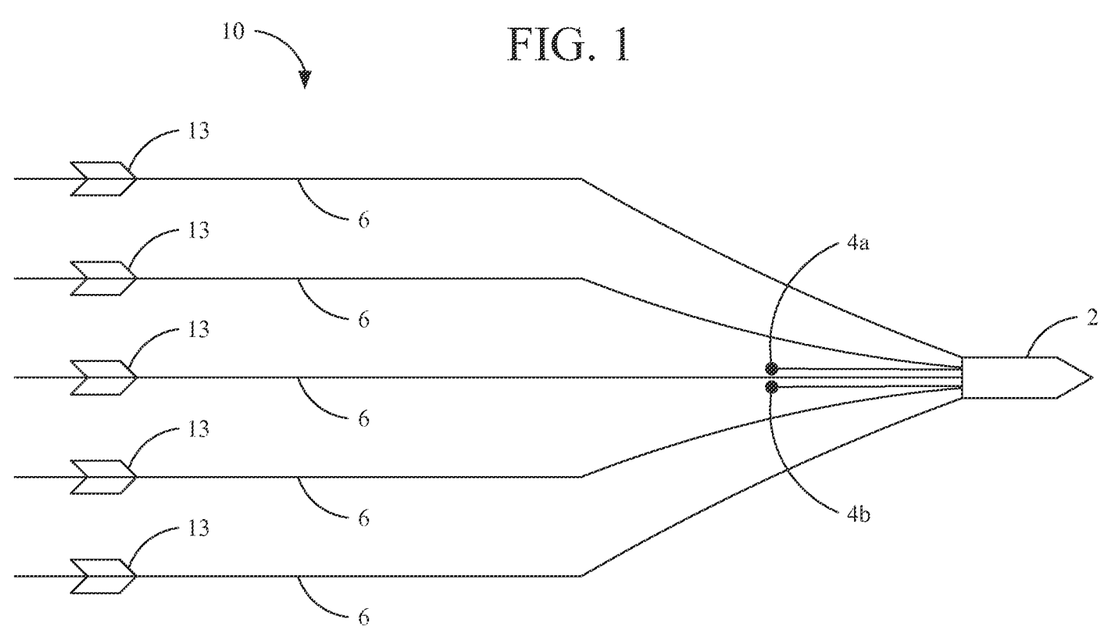
FIG. 1 is an illustration of a plan view of an embodiment of a marine seismic survey system in which embodiments for creating elastic Earth models of a subsurface can be implemented.
Figure 2:
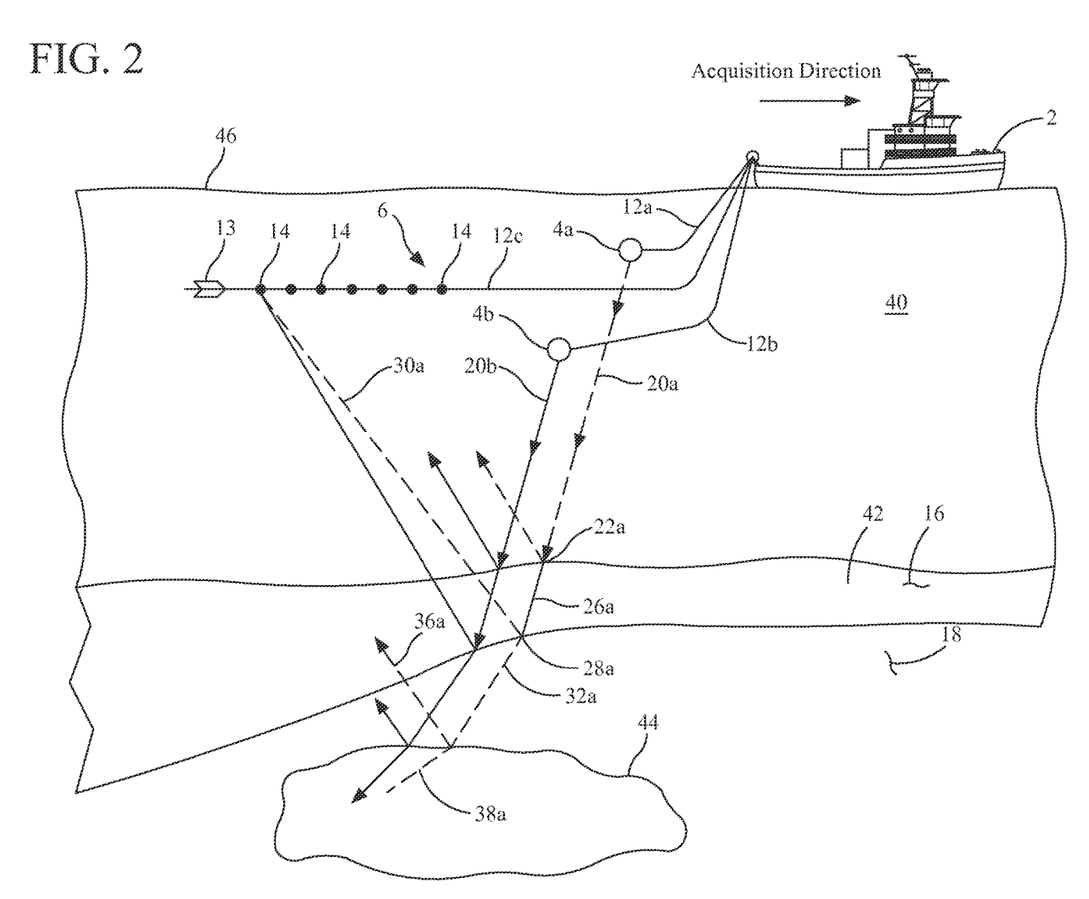
FIG. 2 is an illustration of an elevation view of an embodiment of a marine seismic survey system in which embodiments for creating elastic Earth models of a subsurface can be implemented.

In order to generate an improved Earth model of a subsurface region of interest, seismic data covering the subsurface region of interest are obtained or recorded. Any suitable method for obtaining seismic data known and available in the art can be used including land-based and marine surveys. A seismic data acquisition process and system is illustrated in FIGS. 1 and 2. Referring initially to FIG. 1, a marine data acquisition system 10 includes a ship 2 towing a plurality of streamers 6. The streamers may extend one or more kilometers behind the ship 2. Each of the streamers 6 can include one or more birds 13 that maintains streamer 6 in a known fixed position relative to other streamers 6, and the birds 13 are capable of moving each streamer 6 as desired according to bi-directional communications birds 13 can receive from the ship 2. Each streamer includes a plurality of receivers 14 (FIG. 2) arranged in series along the streamer.

The marine data acquisition system also includes one or more source arrays 4a,b. The source arrays generate the seismic waves for the seismic survey. In one embodiment, these source arrays are towed behind the same ship 2 that is towing the streamers. Alternatively, the source arrays are towed behind one or more separate ships. The source arrays 4a,b, when towed behind the same ship as the streamers can be located between the receivers and the ship, i.e., placed in front of the receivers 14 as illustrated in FIG. 2 or can be located behind the receivers. In one embodiment, the towed source arrays are located both behind and in front of the receivers 14.

The seismic waves generated by source arrays 4a,b propagate downward, reflect off of, and penetrate the seafloor, wherein the refracted waves eventually are reflected by one or more reflecting structures back to the surface as discussed below with respect to FIG. 2. The reflected seismic waves propagate upwardly and are detected by the receivers 14 provided on the streamers 6. This process is generally referred to as "shooting" a particular seafloor area, with the seafloor area referred to as a "cell" and the sea surface referred to as a "free surface."

Referring now to FIG. 2, the data acquisition system 10 of FIG. 1 is illustrated with the ship 2 deployed on the ocean surface 46. The ship tows the streamers 6. Each streamer includes a cable 12c and a plurality of receivers 14 spaced along the length of the cable. The ship also tows the sources 4a,b, and each source is attached to a respective cable 12a,b. Suitable sources are known and available in the art and are capable of transmitting respective sound waves or signals 20a,b. For the sake of simplicity, only a first or single transmitted signal 20a,b is illustrated for each sources; however, each source can simultaneously transmit multiple signals 20. A first transmitted signal 20a propagates through the ocean 40 and is incident at first refraction and reflection point 22a, which corresponds to the ocean floor 42. A first reflected signal 24a from the first transmitted signal 20a travels upward from the ocean floor 42 to the receivers 14.

As those of skill in the art can appreciate, whenever a signal—optical or acoustical—travels from one medium with a first index of refraction $n_1$ and meets with a different medium, with a second index of refraction $n_2$, a portion of the transmitted signal is reflected at an angle equal to the incident angle (according to the well-known Snell's law), and a second portion of the transmitted signal can be refracted (again according to Snell's law). In accordance with this principle, the first transmitted signal 20a generates both the first reflected signal 24a, and a first refracted signal 26a. The first refracted signal 26a travels through a sediment layer 16, which can be generically referred to as first subsurface layer 16, located beneath the ocean floor 42, and can now be considered a "new" transmitted signal. When this "new" transmitted signal encounters a second medium at a second refraction/reflection point 28a, a second reflected signal 30a and a second refracted signal 32a are generated.

When the subsurface contains a significant hydrocarbon deposit 44 located, for example, a third medium or solid earth/rock layer 18, which can be generically referred to as second subsurface layer 18, below the first subsurface layer, a third reflected signal 36a and a third refracted signal 38a are generated. The data acquisition system 10 receives the reflected and refracted signals and generates seismic data that are used to discover and image the hydrocarbon deposit 44. Once collected, the seismic data are processed to generate images used by those of skill in the art to identify subsurface features.

One technique applied to process the seismic data is migration. In general, seismic migration relocates the events, e.g., reflections from subsurface interfaces, in either time or space to the actual location at which the events occurred in the subsurface from the location at which those events where recorded. The result of migration is a more accurate image of the subsurface structures. Suitable migration techniques include, but are not limited to, Kirchhoff depth migration, Gaussian Beam Migration, Wave-equation migration and Reverse Time Migration (RTM).

The theory and implementation of true RTM has been developed and presented by both Y. Zhang and J. Sun in their 2009 article entitled "Practical Issues of Reverse Time Migration: True-Amplitude Gathers, Noise Removal and Harmonic-Source Encoding," published in First Break, Vol. 26, pages 19-25, incorporated herein by reference and S. Xu, Y. Zhang and B. Tang (hereinafter "XU et. al.") in their 2011 article entitled "3D Angle Gathers from Reverse Time Migration," published in Geophysics, Vol. 76, No. 2, pages S77-S92, incorporated herein by reference.

Considering the example of the acoustic, isotropic, constant density, wave equation, migrating a shot record of recorded real seismic data $Q(x, y; x_s, y_s; t)$, with the shot at $(x_s, y_s, z_s=0)$ and the receivers at $(x,y,z=0)$, involves computing the wavefields originating at the source location and observed at the receiver locations. Based on the source or incident wavefield expanding with time and the recorded or reflected wavefield computed backward in time, the source wave field is denoted as $p_F$ and the recorded wavefield is denoted as $p_B$ in the equations:

$$\begin{cases} \left(\dfrac{1}{v^2}\dfrac{\partial^2}{\partial t^2} - \Delta\right) p_F(\vec{x}; t; \vec{x}_s) = 0, \\ p_F(x, y, z = 0; t; \vec{x}_s) = \delta(\vec{x} - \vec{x}_s)\int_{-\infty}^{t} f(t')dt', \end{cases} \quad (1)$$

and $$\begin{cases} \left(\dfrac{1}{v^2}\dfrac{\partial^2}{\partial t^2} - \Delta\right) p_B(\vec{x}; t; \vec{x}_s) = 0, \\ p_B(x, y, z = 0; t; \vec{x}_s) = Q(x, y; x_s, y_s; t), \end{cases} \quad (2)$$

where $v=v(\vec{x})$ is the velocity, f(t) is the source signature and $\Delta = \partial_x^2 + \partial_y^2 + \partial_z^2$ is the Laplacian operator.

Further, it can be shown that wave propagation equation (1) and wave propagation equation (2), when combined with the three dimensional imaging condition:

$$R(\vec{x}; \theta; \varphi) = 16\pi \int\int\int\int \frac{v(\vec{x})}{\sin\theta'}\delta(\theta' - \theta)\delta(\varphi' - \varphi) p_B p_F dt d\vec{x}_s d\theta' d\varphi' \quad (3)$$

where θ is the reflection angle at the imaging location and φ is the azimuth angle at the imaging location, provide AVA friendly migration amplitude in the subsurface angle domain as described by XU et. al.

RTM can be used to estimate at least one of velocity and impedance perturbations. Consider the acoustic equation with both velocity $v(\vec{x})$ and density $\rho(\vec{x})$ variations as follows:

$$\left(\frac{1}{v^2}\frac{\partial^2}{\partial t^2} - \rho\nabla\frac{1}{\rho}\cdot\nabla\right) p(\vec{x}; t; \vec{x}_s) = \delta(\vec{x} - \vec{x}_s)f(t). \quad (4)$$

For given initial velocity $v_0(\vec{x})$ and density $\rho_0(\vec{x})$ models, the perturbed wavefield $\delta p(\vec{x};t;\vec{x}_s) = p - p_0$ satisfies the following equation:

$$\left(\frac{1}{v_0^2}\frac{\partial^2}{\partial t^2} - \rho_0\nabla\frac{1}{\rho_0}\cdot\nabla\right)\delta p(\vec{x}; t; \vec{x}_s) = \left(\frac{2\delta v}{v_0^3}\frac{\partial^2}{\partial t^2} - \left(\nabla\frac{\delta\rho}{\rho_0}\right)\cdot\nabla\right) p_0(\vec{x}; t; \vec{x}_s), \quad (5)$$

where $\delta v = v - v_0$ and $\delta\rho = \rho - \rho_0$ denote the velocity and density perturbations, respectively. Using the method developed by Jin, S., R. Madariaga, J. Virieux, and G. Lambaré, "Two-Dimensional Asymptotic Iterative Elastic Inversion", Geophysical Journal International, 108, 575-588 (1992) and Forgues, E., and G. Lambaré, "Parameterization Study For Acoustic And Elastic Ray+Born Inversion", Journal of Seismic Exploration, 6, 253-277 (1997), the ray-based relation between the perturbed geological models and wavefield can be obtained as:

$$\frac{\delta v}{v_0} + \cos^2\theta\frac{\delta\rho}{\rho_0} = \quad (6)$$

$$-32\pi \int\int\int\int \frac{v_0(\vec{x})}{\sin\theta'}\cos^2\theta' \frac{\cos\alpha_s}{v_0(\vec{x}_s)}\frac{\cos\alpha_r}{v_0(\vec{x}_r)} A_s A_r e^{-i\omega(\tau_s + \tau_r)}$$

$$\delta Q \delta(\theta' - \theta) d\vec{x}_r d\vec{x}_s d\omega d\theta',$$

where $A_s$ ($A_r$) is the amplitude of the Green's function from the source (receiver) to the image point, $\tau_s$ ($\tau_r$) is the travel time between the source (receiver) and the image point and $\delta Q$ is the difference between the recorded real seismic data and the predicted data from forward modelling using the initial velocity and density models. In the context of RTM, equation (6) can be rephrased by modifying the imaging condition set forth in equation (3) as follows:

$$\sin^2\theta \frac{\delta v}{v} + \cos^2\theta \frac{\delta(v\rho)}{v\rho} = \quad (7)$$

$$-32\pi \int \int \int \frac{v_0(\vec{x})}{\sin\theta'} \cos^2\theta' \delta(\theta' - \theta) \frac{\hat{p}_B(\omega)\hat{p}_F(\omega)}{i\omega} d\vec{x}_s d\omega d\theta'.$$

where the asymptotic forms of $\hat{p}_F(\omega)$ and $\hat{p}_B(\omega)$ have been used (see equations 12 and 13 in Zhang Y., A. Ratcliffe, G. Roberts, and L. Duan, "Amplitude-Preserving Reverse Time Migration: From Reflectivity To Velocity And Impedance Inversion", Geophysics, Vol. 79, No. 6, P. S271-S283 (2014). Equation (7) indicates that if subsurface angle gathers are output with a proper imaging condition, the near angle images predict the impedance perturbation ($\delta(v\rho)/(v\rho)$), while the far angle images can be used to estimate the velocity perturbation ($\delta v/v$). Therefore, these embodiments separate the effects of velocity and density on the stacked image by outputting angle domain CIGs.

Equation (7), however, is derived from an acoustic wave equation and, with some manipulation related to an extra $\cos^2\theta$ factor in the RTM formulation, discussed in Appendix B of Zhang et al. (2014), the left hand side of equation (7) can be identified as an acoustic form of the Aki and Richards (1980) approximation to the Zoeppritz PP equation. Acoustic waves are compressional waves, and the use of an acoustic wave equation limits the applicability of equation (7) to an acoustic Earth. Shear wavefields are not covered by the acoustic wave equation, i.e., the shear velocities are held to be zero, and other type of wave field transitions, pressure to shear (PS), shear to pressure (SP) and shear to shear (SS), as well as the shear wave terms in the PP wavefield transitions itself, are not covered by equation (7). Therefore, this equation potentially cannot be accurately applied to real acquired seismic data, as the real data are elastic data.

Embodiments replace the acoustic equation with an elastic earth model equation that computes or estimates the reflectivity of plane waves at reflection and refraction interfaces in the subsurface. Suitable elastic Earth model equations include the full elastic wave equations of Zoeppritz or any suitable approximation to the Zoeppritz elastic wave equations, for example, from Aki and Richards (1980). Use of the elastic wave equation permits elastic perturbations to be used in determining an accurate Earth model of the subsurface and in particular the velocity, density and shear wave velocity in the subsurface.

In one embodiment, an approximation to the Zoeppritz PP equation is a version provided by Shuey R. T., Geophysics, Vol. 50, No. 4, pp. 609-614 (1985):

$$R_{pp}(\theta) = \frac{1}{2}\left[\frac{\delta V_P}{V_P} + \frac{\delta \rho}{\rho}\right] + \left[\frac{1}{2}\frac{\delta V_P}{V_P} - 4\left(\frac{V_S}{V_P}\right)^2 \frac{\delta V_S}{V_S} - 2\left(\frac{V_S}{V_P}\right)^2 \frac{\delta \rho}{\rho}\right]\sin^2\theta + \quad (8)$$

$$\frac{1}{2}\frac{\delta V_P}{V_P}(\tan^2\theta - \sin^2\theta)$$

This equation expresses the (PP) reflectivity as a function of incidence angle. The perturbations include both pressure, P and shear, S terms. After the previously mentioned manipulation related to the extra $\cos^2\theta$ factor in the RTM formulation, the right-hand side of equation (8), which is the elastic wave approximation of the PP Zoeppritz equation, replaces the left-hand side of equation (7):

$$\sin^2\theta \frac{\delta v}{v} + \cos^s\theta \frac{\delta(v\rho)}{v\rho}.$$

The result is an elastic wave equation fit to the angle gathers calculated from the acquired seismic data:

$$\frac{1}{2}\left[\frac{\delta V_P}{V_P} + \frac{\delta \rho}{\rho}\right]\cos^2\theta + \left[\frac{1}{2}\frac{\delta V_P}{V_P} - 4\left(\frac{V_S}{V_P}\right)^2 \frac{\delta V_S}{V_S} - 2\left(\frac{V_S}{V_P}\right)^2 \frac{\delta \rho}{\rho}\right]\sin^2\theta\cos^2\theta + \quad (9)$$

$$\frac{1}{2}\frac{\delta V_P}{V_P}(\tan^2\theta - \sin^2\theta)\cos^2\theta =$$

$$-32\pi \int \int \int \frac{v_0(\vec{x})}{\sin\theta'} \cos^2\theta' \delta(\theta' - \theta) \frac{\hat{p}_B(\omega)\hat{p}_F(\omega)}{i\omega} d\vec{x}_s d\omega d\theta'$$

As illustrated, equation (8) includes three terms on the right-hand side of the equation. Reading from left to right, the first term is a zero angle term, and the second term is for angles up to 30°. The third term covers higher angles and in one embodiment is dropped, as the analysis is limited to angles up to 30° due to converted wave noise.

Therefore, equation (8) is truncated by removing the third term, which yields:

$$R_{pp}(\theta) = \frac{1}{2}\left[\frac{\delta V_P}{V_P} + \frac{\delta \rho}{\rho}\right] + \left[\frac{1}{2}\frac{\delta V_P}{V_P} - 4\left(\frac{V_S}{V_P}\right)^2 \frac{\delta V_S}{V_S} - 2\left(\frac{V_S}{V_P}\right)^2 \frac{\delta \rho}{\rho}\right]\sin^2\theta \quad (10)$$

After the previously mentioned manipulation related to the extra $\cos^2\theta$ factor in the RTM formulation, the right-hand side of equation (10), which is the elastic wave approximation of the PP Zoeppritz equation, replaces the left-hand side of equation (7):

$$\sin^2\theta \frac{\delta v}{v} + \cos^s\theta \frac{\delta(v\rho)}{v\rho}.$$

The result is an elastic wave equation fit to the angle gathers calculated from the acquired seismic data:

$$\frac{1}{2}\left[\frac{\delta V_P}{V_P} + \frac{\delta \rho}{\rho}\right]\cos^2\theta + \quad (11)$$

$$\left[\frac{1}{2}\frac{\delta V_P}{V_P} - 4\left(\frac{V_S}{V_P}\right)^2 \frac{\delta V_S}{V_S} - 2\left(\frac{V_S}{V_P}\right)^2 \frac{\delta \rho}{\rho}\right]\sin^2\theta\cos^2\theta =$$

$$-32\pi \int \int \int \frac{v_0(\vec{x})}{\sin\theta'} \cos^2\theta' \delta(\theta' - \theta) \frac{\hat{p}_B(\omega)\hat{p}_F(\omega)}{i\omega} d\vec{x}_s d\omega d\theta'$$

Equation (9), or equation (11) when the angle range is restricted below 30°, is then used to generate elastic model perturbations in, for example, p-velocity, s-velocity and density in order to match the elastic wave equation to the angle gathers. These perturbations can be generated once or over a plurality of iterations. The result is an improved Earth model and image of the subsurface.

Figure 3:
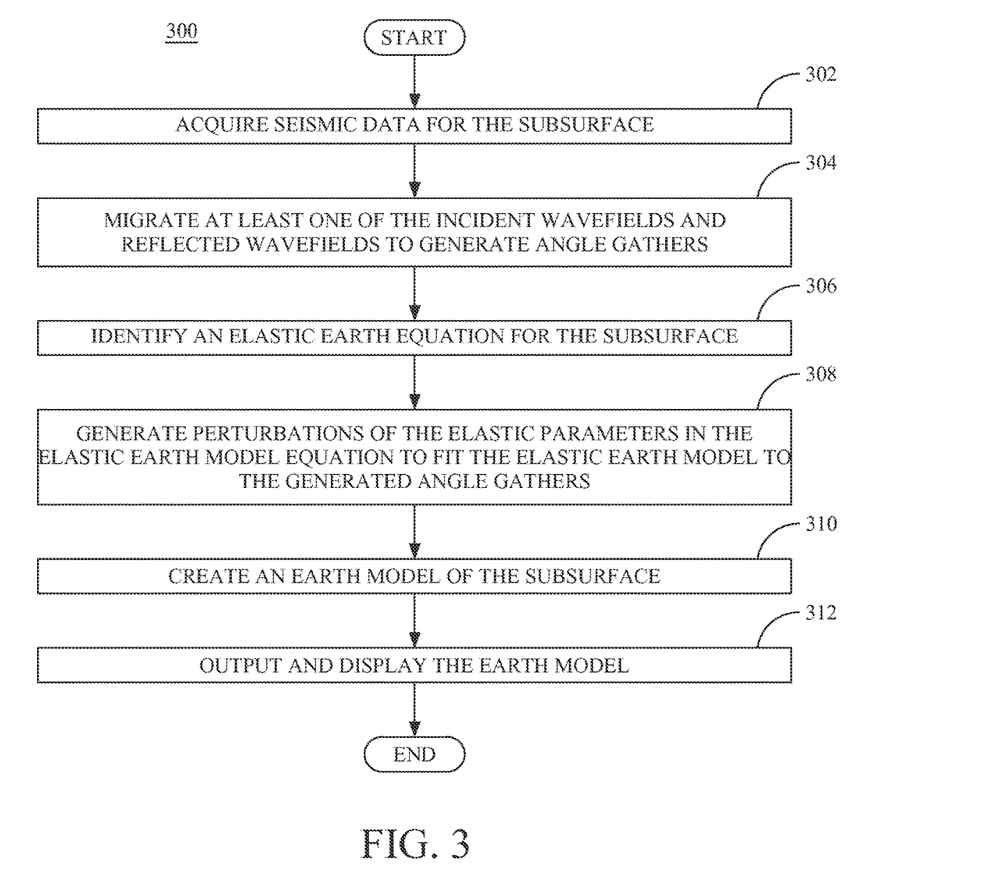
FIG. 3 is a flowchart illustrating an embodiment of a method for creating an elastic Earth model for a subsurface.

Referring now to FIG. 3, an embodiment of a method for creating an Earth model of a subsurface 300 is illustrated. Initially, seismic data for the subsurface are acquired 302. The seismic data can be acquired or read from an existing database of seismic data. Alternatively, the seismic data are generated using any suitable type of seismic data acquisition system known and available in the art. These seismic data acquisition systems include land-based acquisition systems and marine-based acquisition systems. The subsurface includes one or more reflectors such as interfaces between layers having different elastic properties or reservoirs. Therefore, the seismic data include at least one of the incident wavefields and reflected wavefields associated with at least one reflector in the subsurface.

At least one of the incident or source wavefields and reflected or receiver wavefields are migrated to generate angle gathers for the seismic data 304. Suitable methods for migrating wavefields include, but are not limited to Kirchhoff depth migration, Gaussian beam migration, wave-equation migration and reverse time migration. Preferably, reverse time migration is used to generate the angle gathers.

An elastic Earth model equation is identified for the subsurface 306. The elastic Earth model equation is suitable for at least one of the incident wavefields and the reflected wavefields in the acquired seismic data. Suitable pairs containing at least one of the incident wavefields and reflected wavefields include both pressure wavefields and shear wavefields. Therefore, the elastic Earth model accommodates pressure-pressure, pressure-shear, shear-shear and shear-pressure transitions between incident and reflected wavefields. In one embodiment, the elastic Earth model is a function of the reflection angle between the incident wavefields and reflected wavefields and of elastic parameters for the subsurface. Suitable elastic parameters include, but are not limited to, p-wave velocity, s-wave velocity, density, anisotropy and impedance.

In one embodiment, the elastic Earth model is a full elastic Zoeppritz amplitude versus angle equation or an approximation of the full elastic Zoeppritz amplitude versus angle equation. Any suitable representation of the Zoeppritz equation or approximation of the Zoeppritz equation that accommodates the acquired wavefields can be used. Therefore, in one embodiment, the elastic Earth model equation is a three-term Shuey equation. In a further embodiment, the third, higher angle term is removed in order to limit the Shuey equation to reflection angles up to about 30°.

Perturbations of one or more of the elastic parameters in the elastic Earth model equation are generated to fit the elastic Earth model equation to the generated angle gathers 308. Perturbations or changes in individual elastic parameters can be made or in combinations of multiple elastic parameters. In one embodiment, perturbations are generated a single time in order to fit the elastic Earth model to the actual acquired seismic data as expressed in the generated angle gathers. Alternatively, an iterative process is followed, in which multiple perturbations are successively generated to move the elastic Earth model into a fit with the generated angle gathers. The generated perturbations are to create the Earth model of the subsurface 310. The further comprising outputting and displaying the created Earth model of the subsurface can be outputted and displayed 312 using suitable methods and devices known and available in the art. Therefore, an improved Earth model is generated of the subsurface that takes into account both pressure wavefields and shear wavefields and the transitions between pressure and shear wavefields.

Figure 4:
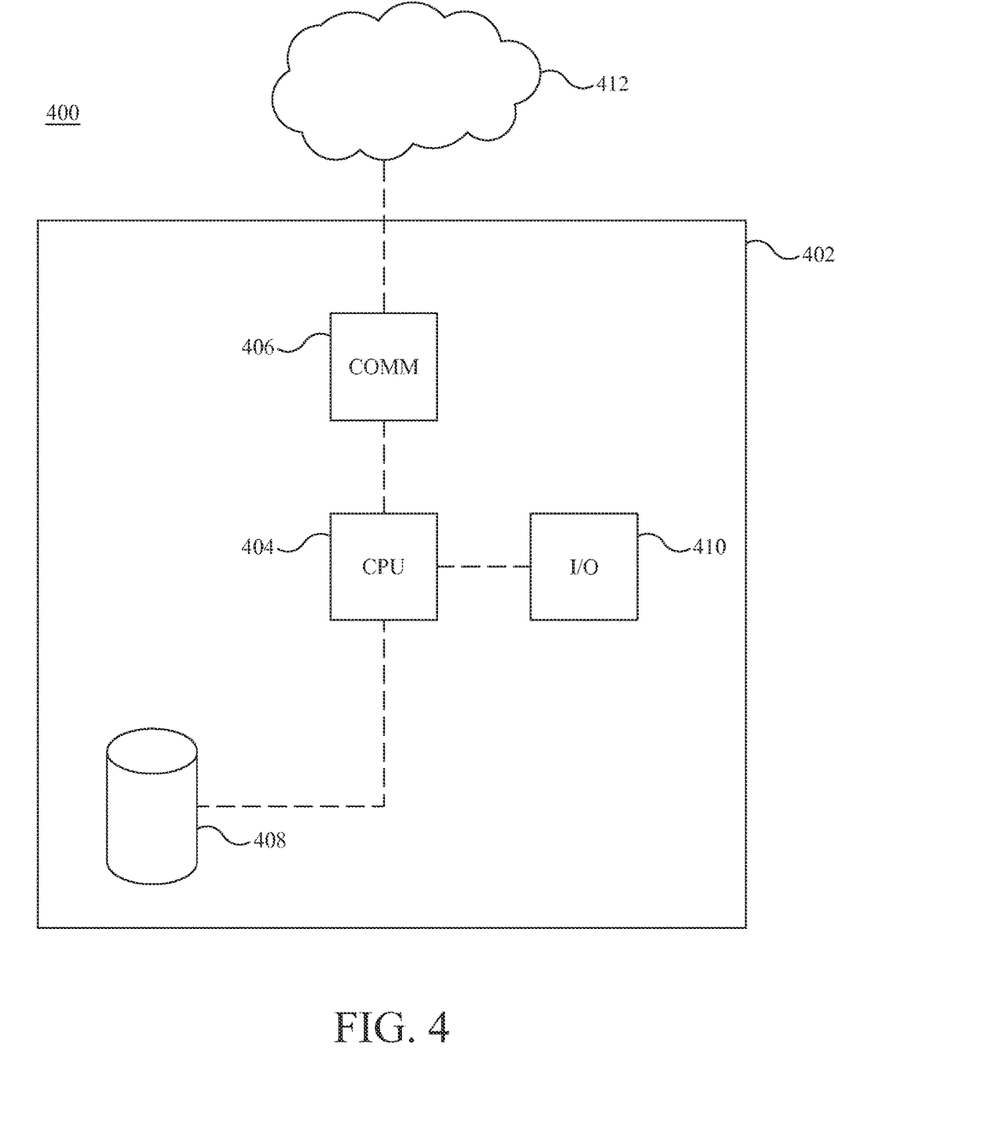
FIG. 4 illustrates a data processing device or system which can be used to implement the embodiments.

Referring now to FIG. 4, embodiments are directed to a computing system 400 for creating an Earth model of a subsurface. In one embodiment, a computing device for performing the calculations as set forth in the above-described embodiments may be any type of computing device capable of obtaining, processing and communicating multi-vintage seismic data associated with seismic surveys conducted at different time periods. The computing system 400 includes a computer or server 402 having one or more central processing units 404 in communication with a communication module 406, one or more input/output devices 410 and at least one storage device 408.

The communication module is used to acquire seismic data of the subsurface including at least one of the incident wavefields and reflected wavefields. The acquired seismic data are stored in the storage device. In addition, the storage device is used to store the generated angle gathers, the elastic Earth model equation, the current elastic parameters for the elastic Earth model equation and the created Earth model. The input/output device can also be used to communicate or display the created Earth model, for example, to a user of the computing system.

The processor is in communication with the communication module and storage device and is configured to migrate at least one of the incident wavefields and reflected wavefields to generate angle gathers for the seismic data, to identify for the subsurface an elastic Earth model equation for the incident wavefields and the reflected wavefields in the acquired seismic data where the elastic Earth model is a function of reflection angle between the incident wavefields and reflected wavefields and elastic parameters, to generate perturbations of the elastic parameters in the elastic Earth model equation to fit the elastic Earth model equation to the generated angle gathers and to use the generated perturbations to create the Earth model of the subsurface.

In one embodiment, the processor is further configured to use Kirchhoff depth migration, Gaussian beam migration, wave-equation migration or reverse time migration to migrate at least one of the incident and reflected wavefields. In another embodiment, the processor is further configured to identify a full elastic Zoeppritz amplitude versus angle equation or an approximation of the full elastic Zoeppritz amplitude versus angle equation and, in a further embodiment, to limit the elastic Earth model equation to reflection angles up to about 30°. In one embodiment, the incident wavefields and reflected wavefields include both pressure wavefields and shear wavefields, and the elastic parameters include p-wave velocity, s-wave velocity, density, anisotropy and impedance.

Suitable embodiments for the various components of the computing system are known to those of ordinary skill in the art, and this description includes all known and future variants of these types of devices. The communication module provides for communication with other computing systems, databases and data acquisition systems across one or more local or wide area networks 412. This includes both wired and wireless communication. Suitable input/output devices include keyboards, point and click type devices, audio devices, optical media devices and visual displays.

Suitable storage devices include magnetic media such as a hard disk drive (HDD), solid state memory devices including flash drives, ROM and RAM and optical media. The storage device can contain data as well as software code for executing the functions of the computing system and the functions in accordance with the methods described herein. Therefore, the computing system 400 can be used to implement the methods described above associated with creating elastic Earth models of a subsurface. Hardware, firmware, software or a combination thereof may be used to perform the various steps and operations described herein.

Methods and systems in accordance with embodiments can be hardware embodiments, software embodiments or a combination of hardware and software embodiments. In one embodiment, the methods described herein are implemented as software. Suitable software embodiments include, but are not limited to, firmware, resident software and microcode. In addition, methods and systems can take the form of a computer program product accessible from a computer-usable or computer-readable medium providing program code for use by or in connection with a computer, logical processing unit or any instruction execution system. In one embodiment, a machine-readable or computer-readable medium contains a machine-executable or computer-executable code that when read by a machine or computer causes the machine or computer to perform a method for creating an elastic Earth model of a subsurface in accordance with embodiments and to the computer-executable code itself. The machine-readable or computer-readable code can be any type of code or language capable of being read and executed by the machine or computer and can be expressed in any suitable language or syntax known and available in the art including machine languages, assembler languages, higher level languages, object oriented languages and scripting languages.

As used herein, a computer-usable or computer-readable medium can be any apparatus that can contain, store, communicate, propagate, or transport the program for use by or in connection with the instruction execution system, apparatus, or device. Suitable computer-usable or computer readable mediums include, but are not limited to, electronic, magnetic, optical, electromagnetic, infrared, or semiconductor systems (or apparatuses or devices) or propagation mediums and include non-transitory computer-readable mediums. Suitable computer-readable mediums include, but are not limited to, a semiconductor or solid state memory, magnetic tape, a removable computer diskette, a random access memory (RAM), a read-only memory (ROM), a rigid magnetic disk and an optical disk. Suitable optical disks include, but are not limited to, a compact disk-read only memory (CD-ROM), a compact disk-read/write (CD-R/W) and DVD.

The disclosed embodiments provide a computing device, software and method for method for creating elastic Earth models of a subsurface. It should be understood that this description is not intended to limit the invention. On the contrary, the embodiments are intended to cover alternatives, modifications and equivalents, which are included in the spirit and scope of the invention. Further, in the detailed description of the embodiments, numerous specific details are set forth in order to provide a comprehensive understanding of the invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein. The methods or flowcharts provided in the present application may be implemented in a computer program, software, or firmware tangibly embodied in a computer-readable storage medium for execution by a geophysics dedicated computer or a processor.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for seismic exploration of a subsurface, the method comprising:
   acquiring seismic data for the subsurface using a seismic source emitting seismic excitations and receivers detecting the seismic excitation after traveling through the subsurface and converting the detected seismic excitations into the seismic data, wherein the seismic data includes at least one of the incident wavefields and reflected wavefields associated with at least one reflector in the subsurface;
   migrating at least one of the incident wavefields and reflected wavefields to generate angle gathers for the seismic data;
   identifying for the subsurface an elastic Earth model equation for the incident wavefields and the reflected wavefields in the acquired seismic data, the elastic Earth model comprising a function of reflection angle between the incident wavefields and reflected wavefields and elastic parameters;
   generating perturbations of the elastic parameters in the elastic Earth model equation to fit the elastic Earth model equation to the generated angle gathers; and
   using the generated perturbations to create the Earth model of the subsurface for locating a hydrocarbon deposit.

2. The method of claim 1, wherein migrating at least one of the incident and reflected wavefields comprises using Kirchhoff depth migration, Gaussian beam migration, wave-equation migration or reverse time migration.

3. The method of claim 1, wherein identifying the elastic Earth model further comprises identifying a full elastic Zoeppritz amplitude versus angle equation or an approximation of the full elastic Zoeppritz amplitude versus angle equation.

4. The method of claim 1, wherein identifying the elastic Earth model equation further comprises limiting the elastic Earth model equation to reflection angles up to about 30°.

5. The method of claim 1, wherein identifying the elastic Earth model equation further comprises identifying a three-term Shuey equation and removing a third, higher angle term to limit the Shuey equation to reflection angles up to about 30°.

6. The method of claim 1, wherein the incident wavefields and reflected wavefields comprise both pressure wavefields and shear wavefields.

7. The method of claim 1, wherein the elastic parameters comprise p-wave velocity, s-wave velocity, density, anisotropy or impedance.

8. The method of claim 1, further comprising outputting and displaying the created Earth model of the subsurface.

9. A non-transitory computer-readable medium containing computer-executable code that when read by a computer causes the computer to perform a method for seismic of a subsurface, the method comprising:
   acquiring seismic data for the subsurface using a seismic source emitting seismic excitations and receivers detecting the seismic excitation after traveling through the subsurface and converting the detected seismic excitations into the seismic data, wherein the seismic data includes at least one of the incident wavefields and reflected wavefields associated with at least one reflector in the subsurface;

migrating at least one of the incident wavefields and reflected wavefields to generate angle gathers for the seismic data;

identifying for the subsurface an elastic Earth model equation for the incident wavefields and the reflected wavefields in the acquired seismic data, the elastic Earth model comprising a function of reflection angle between the incident wavefields and reflected wavefields and elastic parameters;

generating perturbations of the elastic parameters in the elastic Earth model equation to fit the elastic Earth model equation to the generated angle gathers; and using the generated perturbations to create the Earth model of the subsurface for locating a hydrocarbon deposit.

10. The non-transitory computer-readable medium of claim 9, wherein migrating the at least one of the incident and reflected wavefields comprises using Kirchhoff depth migration, Gaussian beam migration, wave-equation migration or reverse time migration.

11. The non-transitory computer-readable medium of claim 9, wherein identifying the elastic Earth model further comprises identifying a full elastic Zoeppritz amplitude versus angle equation or an approximation of the full elastic Zoeppritz amplitude versus angle equation.

12. The non-transitory computer-readable medium of claim 9, wherein identifying the elastic Earth model equation further comprises limiting the elastic Earth model equation to reflection angles up to about 30°.

13. The non-transitory computer-readable medium of claim 9, wherein the incident wavefields and reflected wavefields comprise both pressure wavefields and shear wavefields.

14. The non-transitory computer-readable medium of claim 9, wherein the elastic parameters comprise p-wave velocity, s-wave velocity, density, anisotropy or impedance.

15. A computing system for seismic exploration of a subsurface, the computing system comprising:

a storage device comprising seismic data for the subsurface, the seismic data being acquired subsurface using a seismic source emitting seismic excitations and receivers detecting the seismic excitation after traveling through the subsurface and converting the detected seismic excitations into the seismic data, wherein the seismic data includes at least one of the incident wavefields and reflected wavefields associated with at least one reflector in the subsurface; and a processor in communication with the storage device and configured to:

migrate at least one of the incident wavefields and reflected wavefields to generate angle gathers for the seismic data;

identify for the subsurface an elastic Earth model equation for the incident wavefields and the reflected wavefields in the acquired seismic data, the elastic Earth model comprising a function of reflection angle between the incident wavefields and reflected wavefields and elastic parameters;

generate perturbations of the elastic parameters in the elastic Earth model equation to fit the elastic Earth model equation to the generated angle gathers; and use the generated perturbations to create the Earth model of the subsurface for locating a hydrocarbon deposit.

16. The computing system of claim 15, wherein the processor is further configured to use Kirchhoff depth migration, Gaussian beam migration, wave-equation migration or reverse time migration to migrate at least one of the incident and reflected wavefields.

17. The computing system of claim 15, wherein the processor is further configured to identify a full elastic Zoeppritz amplitude versus angle equation or an approximation of the full elastic Zoeppritz amplitude versus angle equation.

18. The computing system of claim 15, wherein the processor is further configured to limit the elastic Earth model equation to reflection angles up to about 30°.

19. The computing system of claim 15, wherein the incident wavefields and reflected wavefields comprise both pressure wavefields and shear wavefields.

20. The computing system of claim 15, wherein the elastic parameters comprise p-wave velocity, s-wave velocity, density, anisotropy or impedance.

* * * * *